(12) United States Patent
Heo et al.

(10) Patent No.: US 8,786,322 B2
(45) Date of Patent: Jul. 22, 2014

(54) GATE DRIVER CIRCUIT AND OPERATING METHOD THEREOF

(71) Applicant: Samsung Electro-Mechanics Co., Ltd., Suwon (KR)

(72) Inventors: Chang Jae Heo, Suwon (KR); Sung Man Pang, Suwon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/772,537

(22) Filed: Feb. 21, 2013

(65) Prior Publication Data

US 2014/0176226 A1 Jun. 26, 2014

(30) Foreign Application Priority Data

Dec. 21, 2012 (KR) .................. 10-2012-0150519

(51) Int. Cl.
*H03B 1/00* (2006.01)
*H03K 3/00* (2006.01)

(52) U.S. Cl.
USPC ........... 327/108; 327/109; 327/110; 327/111; 327/112; 326/82; 326/83

(58) Field of Classification Search
USPC ........................... 327/108, 109, 110, 111, 112
See application file for complete search history.

(56) References Cited

U.S. PATENT DOCUMENTS

| 5,958,026 A | 9/1999 | Goetting et al. |
| 6,320,433 B1 * | 11/2001 | Hinterscher ................... 327/112 |
| 7,355,453 B2 * | 4/2008 | Watt ............................... 326/87 |

FOREIGN PATENT DOCUMENTS

| JP | 09-270698 | 10/1997 |
| JP | 2000-059201 | 2/2000 |

OTHER PUBLICATIONS

Korean Office Action mailed Nov. 29, 2013 in corresponding Korean Application No. 10-2012-0150519.

* cited by examiner

*Primary Examiner* — John Poos
(74) *Attorney, Agent, or Firm* — Staas & Halsey LLP

(57) ABSTRACT

There are provided a gate driver circuit and an operating method thereof. The gate driver circuit includes an output signal generating unit including a plurality of switch devices generating output signals, a selecting circuit unit generating a plurality of control signals according to a set selection state, and a plurality of driving circuit units receiving a reference signal and the plurality of control signals to control the plurality of switch devices, wherein the plurality of switch devices determine a level of the output signal by the plurality of control signal.

11 Claims, 6 Drawing Sheets

GATE DRIVER CIRCUIT AND OPERATING METHOD THEREOF

CROSS-REFERENCE TO RELATED APPLICATIONS

This application claims the priority of Korean Patent Application No. 10-2012-0150519 filed on Dec. 21, 2012, in the Korean Intellectual Property Office, the disclosure of which is incorporated herein by reference.

BACKGROUND OF THE INVENTION

1. Field of the Invention

The present invention relates to a gate driver circuit generating an output signal for driving an insulated gate bipolar transistor (IGBT), and an operating method thereof.

2. Description of the Related Art

In a gate driver circuit controlling an operation of an insulated gate bipolar transistor (IGBT), when a plurality of IGBTs having different ratings are driven, a gate driver circuit appropriate for characteristics of the IGBTs is required in order to satisfy turning-on and turning-off speeds appropriate for ratings of the respective IGBTs. According to the related art, a method of inserting a resistor between an output terminal of the gate driver circuit and a gate terminal of the IGBT or controlling a size of a transistor connected to the output terminal of the gate driver circuit has been used in order to control the turning-on and turning-off speeds of the IGBT.

In the method of inserting the resistor between the output terminal of the gate driver circuit and the gate terminal of the IGBT to control an output current of the gate driver circuit, when rapid turning-on and turning-off speeds are required, the output current may be raised, and when slow turning-on and turning-off speeds are required, the output current may be lowered. In the method of controlling the size of the transistor connected to the output terminal of the gate driver circuit, in the case in which the size is increased, a source current is increased, such that turning-on and turning-off speeds may be increased, and in the case in which the size is decreased, turning-on and turning-off speeds may be decreased.

However, the above-mentioned two methods are not appropriate for controlling turning-on and turning-off speeds of the plurality of IGBTs having different ratings. In the first method, a circuit having several different resistance values is required in order to generate several output currents, and in the second method, it is required to connect a plurality of circuits having different sizes to one another in series. Therefore, in both of the first and second schemes, the size of the gate driver circuit is increased, and manufacturing costs are also increased.

In the Related Art Document below, Patent Document 1 relates to a semiconductor device and a data output method thereof and discloses a feature of providing a driving signal to certain transistors selected from among a plurality of transistors, and Patent Document 2 relates to a complementary metal oxide semiconductor (CMOS) output buffer circuit for controlling a driving current and discloses a feature of selectively transferring a control signal to an output buffer to control a level of an output current. However, neither of Patent Documents 1 and 2 discloses a feature of generating a control signal according to a connection state of each of a plurality of bonding pads and controlling turning-on/off of a switch device connected to an output terminal by using the generated control signal to control a level of an output current.

RELATED ART DOCUMENT (Patent Document 1) Japanese Patent Laid-Open Publication No. JP 2000-059201

(Patent Document 2) Japanese Patent Laid-Open Publication No. JP 1997-270698

SUMMARY OF THE INVENTION

An aspect of the present invention provides a gate driver circuit capable of generating a driving current for operating insulated gate bipolar transistors (IGBTs) having different ratings using a single circuit by generating a plurality of control signals according to a connection state of each of a plurality of bonding pads and controlling turning-on and turning-off of each of a plurality of switch devices connected to an output terminal of a gate driver circuit from a reference signal and the plurality of control signals, and an operating method thereof.

According to an aspect of the present invention, there is provided a gate driver circuit including: an output signal generating unit including a plurality of switch devices generating output signals; a selecting circuit unit generating a plurality of control signals according to a set selection state; and a plurality of driving circuit units receiving a reference signal and the plurality of control signals to control the plurality of switch devices, wherein the plurality of switch devices determine a level of the output signal by the plurality of control signals.

Each of the plurality of driving circuit units may include at least one of a three-phase inverter circuit and a plurality of analog switch circuits.

The selecting circuit unit may generate the plurality of control signals according to a connection state of each of a plurality of bonding pads.

The selecting circuit unit may determine that values of control signals corresponding to bonding pads that are connected to a predetermined reference voltage among the plurality of bonding pads have a low level and determine that values of remaining control signals corresponding to remaining bonding pads that are floated among the plurality of bonding pads have a high level.

A driving circuit unit receiving the control signal having the low level among the plurality of driving circuit units may control a switch device connected thereto to be turned off.

A driving circuit unit receiving the control signal having the high level among the plurality of driving circuit units may control a switch device connected thereto to be turned on.

Each of the plurality of driving circuit units may include: a P-channel metal oxide semiconductor (PMOS) transistor pull-up connected when the value of the control signal has the low level; and an N-channel MOS (NMOS) transistor pull-down connected when the value of the control signal has the low level.

The PMOS transistor and the NMOS transistor may output the reference signal when the value of the control signal has the high level.

The plurality of switch devices may include a plurality of inverter circuits.

According to another aspect of the present invention, there is provided an operating method of a gate driver circuit, including: generating a plurality of control signals according to a set selection state; controlling turning-on and turning-off of each of a plurality of switch devices using a reference signal and the plurality of control signals; and determining a level of an output signal by turning-on and turning-off operations of each of the plurality of switch devices.

In the generating of the plurality of control signals, the plurality of control signals may be generated according to a connection state of each of a plurality of bonding pads.

In the generating of the plurality of control signals, values of control signals corresponding to bonding pads that are connected to a predetermined reference voltage among the plurality of bonding pads may be determined to have a low level, and values of remaining control signals corresponding to remaining bonding pads that are floated among the plurality of bonding pads may be determined to have a high level.

In the controlling, a switch device to which a control signal having the low level value is input may be turned on.

In the controlling, a switch device to which a control signal having the high level value is input may be turned off.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

Figure 1:
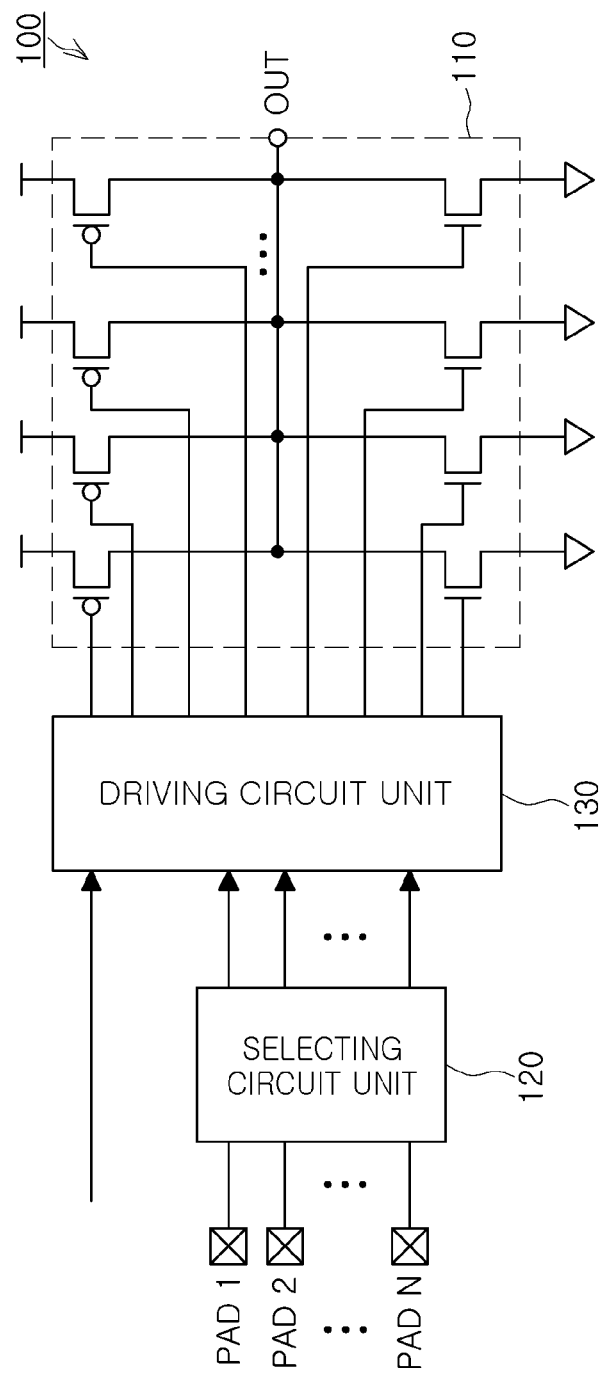
FIG. 1 is a block diagram schematically showing a gate driver circuit according to an embodiment of the present invention.

FIG. 1 is a block diagram schematically showing a gate driver circuit according to an embodiment of the present invention.

Referring to FIG. 1, the gate driver circuit 100 according to the present embodiment may include an output signal generating unit 110 including a plurality of switch devices generating output signals, a selecting circuit unit 120, and a driving circuit unit 130. Although the driving circuit 130 is shown as a single module in FIG. 1, it may be configured of at least two circuits for generating a plurality of signals controlling an operation of the plurality of respective switch devices included in the output signal generating unit 110.

The selecting circuit unit 120 may generate a plurality of control signals according to a set connection state. More specifically, the selecting circuit unit 120 may generate the plurality of control signals transferred to the driving circuit unit 130 according to a connection state of each of a plurality of (hereinafter, referred to as 'N' for convenience of explanation) bonding pads PAD 1, PAD 2, . . . , PAD N. As an example, the selecting circuit unit 120 may generate N control signals having different values according to whether the N bonding pads PAD 1, PAD 2, . . . , PAD N are respectively connected to a predetermined reference voltage or are floated without being connected to any voltage terminal.

The N control signals generated by the selecting circuit unit 120 may be input, together with a separately provided reference signal, to the driving circuit unit 130. That is, the driving circuit unit 130 may receive N+1 signals as an input and generate 2N+2 signals from the N+1 signals. The signals output by the driving circuit unit 130 may be applied to P-channel metal oxide semiconductor (PMOS) transistors or N-channel MOS (NMOS) transistors included in the output signal generating unit 110 to control turning-on/off of the respective transistors. Therefore, the number of each of PMOS transistors and NMOS transistors may be N+1.

A level of an output signal OUT of the gate driver circuit 100 generated by the output signal generating unit 110 may be determined according to turning-on/off of PMOS transistors and NMOS transistors of the respective switch devices. For example, when only one PMOS transistor and NMOS transistor are turned on and all of remaining PMOS transistors and NMOS transistors are turned off by the signals output by the driving circuit 130, the output signal OUT may have a lowest level. On the other hand, when all of the PMOS transistors and the NMOS transistors are simultaneously turned on, the output signal OUT may have a highest level. Therefore, the output signal OUT operating integrated gate bipolar transistors (IGBTs) having various ratings may be generated using a single gate driver circuit 100 as shown in FIG. 1.

Figure 2:
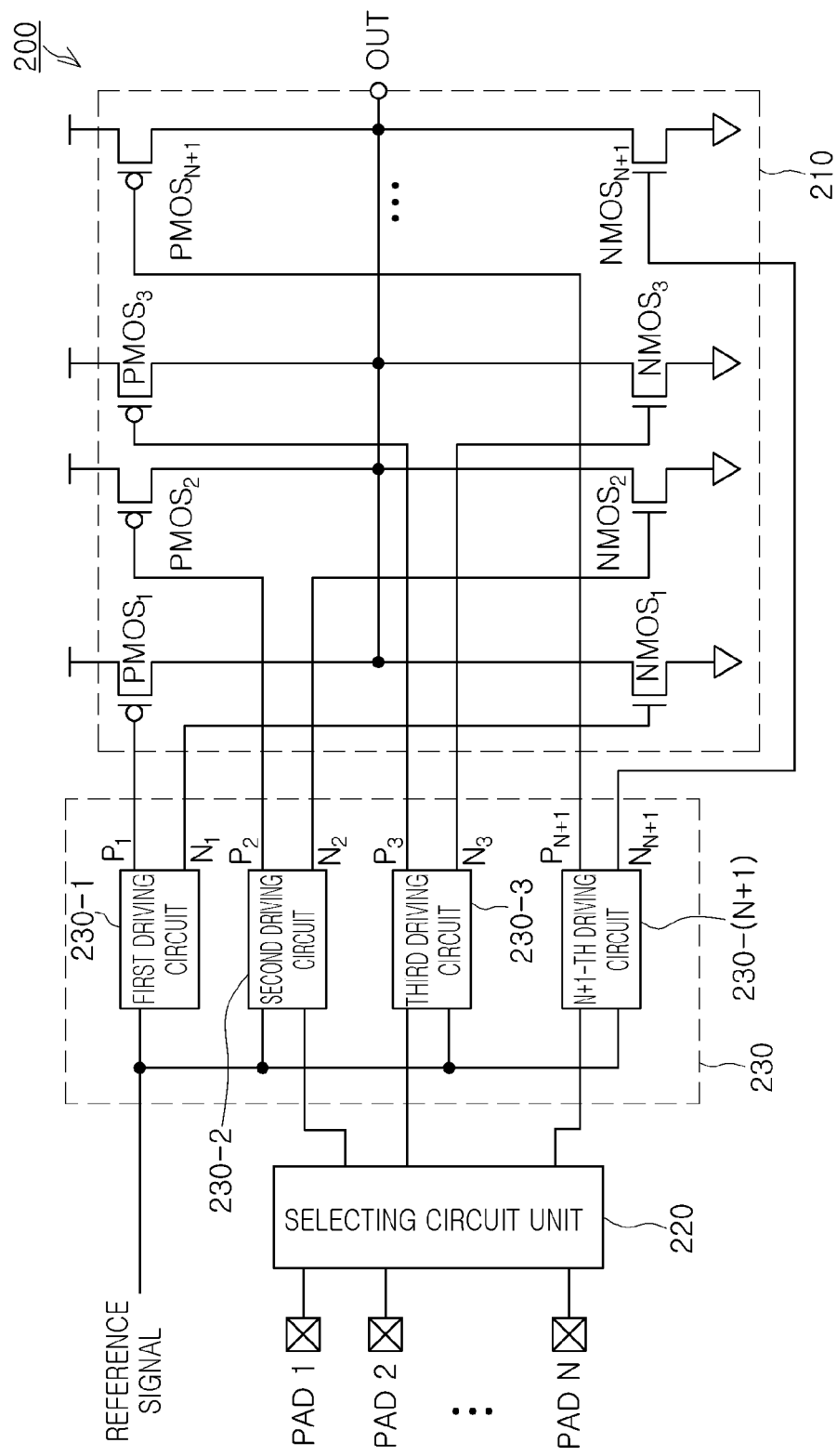
FIG. 2 is a circuit diagram showing the gate driver circuit according to the embodiment of the present invention.

FIG. 2 is a circuit diagram showing the gate driver circuit according to the embodiment of the present invention.

Referring to FIG. 2, the gate driver circuit 200 according to the present embodiment may include an output signal generating unit 210 including a plurality of switch devices generating output signals OUT, a selecting circuit unit 220 generating N control signals according to connection states of bonding pads PAD 1, PAD 2, . . . , PAD N, and a driving circuit unit 230 controlling the plurality of switch devices included in the output signal generating unit 210 based on a reference signal and N control signals.

As described above with reference to FIG. 1, the N bonding pads PAD 1, PAD 2, . . . , PAD N may generate N control signals, and the driving circuit unit 230 may include a total of N+1 driving circuits. The reference signal may be input to each of the N+1 driving circuits 230-1 to 230-(N+1). Meanwhile, the first driving circuit 230-1 may only receive the reference signal to generate the control signal.

When the N control signals are generated according to the connection state of each of the bonding pads PAD 1, PAD 2, . . . , PAD N and are transferred to the second to N+1-th driving circuits 230-2 to 230-(N+1), the driving circuits may generate signals $P_1$ to $P_{N+1}$ controlling PMOS transistors $PMOS_1$ to $PMOS_{N+1}$ included in the output signal generating unit 210 and signals $N_1$ to $N_{N+1}$ controlling NMOS transistors $NMOS_1$ to $NMOS_{N+1}$ included in the output signal generating unit 210, respectively. A level of the output signal OUT may be determined according to turning-on/off of the PMOS transistors $PMOS_1$ to $PMOS_{N+1}$ and the $NMOS_1$ to $NMOS_{N+1}$.

Hereinafter, a detailed operation of the gate driver circuit 200 shown in FIG. 2 will be described with reference to FIGS. 3 through 6.

Figure 3:
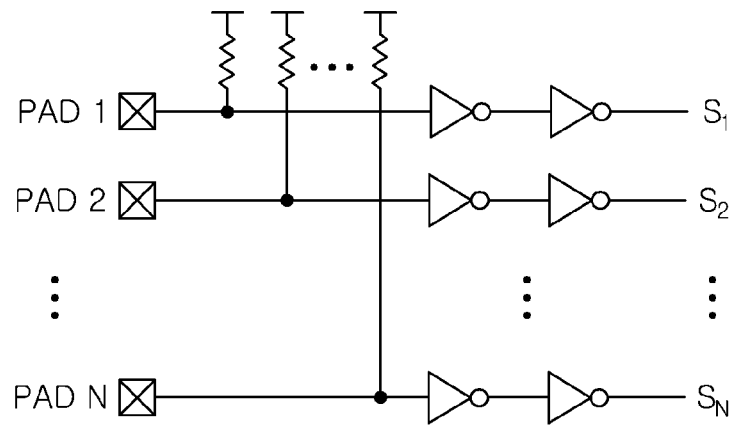
FIGS. 3 and 4 are circuit diagrams showing an example of a configuration of a selecting circuit unit included in the gate driver circuit according to the embodiment of the present invention.
Figure 4:
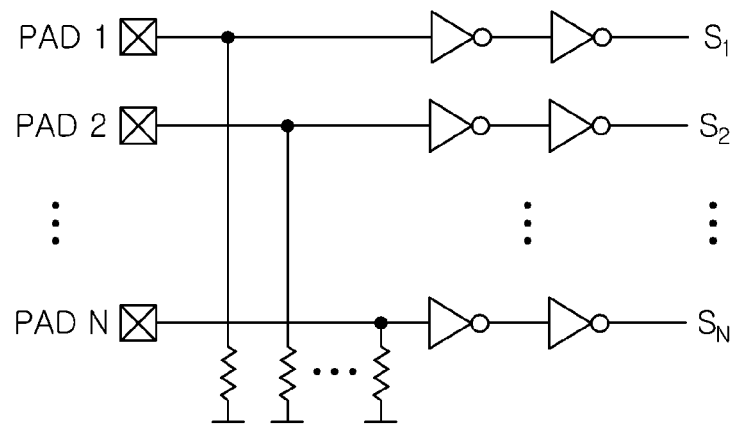

FIGS. 3 and 4 are circuit diagrams showing an example of a configuration of a selecting circuit unit included in the gate driver circuit according to the embodiment of the present invention. For example, in the case that all of the bonding pads PAD 1, PAD 2, . . . , PAD N are connected to a reference voltage Vss having a ground level, when the selecting circuit unit 220 is configured as shown in FIG. 3, all of currents generated by a power supply connected to a pull-up resistor are discharged as the reference voltage having a ground level, such that all of the control signals $S_1$ to $S_N$ may have values having a low level.

To the contrary, when the bonding pads PAD 1, PAD 2, ..., PAD N are not connected to the reference voltage, but are floated, all of the control signals $S_1$ to $S_N$ generated by the power supply connected to the pull-up resistor may have values having a high level. That is, in the case in which the selecting circuit unit 220 is configured of a circuit as shown in FIG. 3, the values of the respective control signals $S_1$ to $S_N$ may be changed by connecting the bonding pads PAD 1, PAD 2, ..., PAD N to the reference voltage having the ground level or floating the bonding pads PAD 1, PAD 2, ..., PAD N.

On the other hand, in the case in which the selecting circuit unit 220 is configured of a circuit as shown in FIG. 4, when the bonding pads PAD 1, PAD 2, ..., PAD N are not connected to the reference voltage, the control signals $S_1$ to $S_N$ may have low level values. In order to change a level of a portion of the values of the control signals $S_1$ to $S_N$ into the high level, a bonding pad corresponding to a control signal to be changed into the high level needs to be connected to the reference voltage Vcc rather than the ground level. In this case, the reference voltage Vcc to which the bonding pad is connected needs to have a value higher than a threshold voltage of an inverter configuring the circuit of FIG. 4.

That is, in the selecting circuit units 220 shown in FIGS. 3 and 4, the values of the output control signals $S_1$ to $S_N$ may be completely different according to the connection state of the bonding pads PAD 1, PAD 2, ..., PAD N. Hereinafter, although the case in which the selecting circuit unit 220 is configured as shown in FIG. 3 is described throughout the present specification for convenience of explanation, the selecting circuit unit 220 may also be configured of a circuit having a configuration different from that of the circuit shown in FIG. 3.

When the connection state of each of the N bonding pads PAD 1, PAD 2, ..., PAD N is determined according to the level of the required output signal OUT, N control signals $S_1$ to $S_N$ according to the connection state may be output. Since the selecting circuit unit 220 shown in FIG. 3 is illustrated, the control signal corresponding to the bonding pad connected to the reference voltage Vss having the ground level may have a low level, and the control signal corresponding to the floated bonding pad may have a high level.

The N control signals $S_1$ to $S_N$ may be transferred to the driving circuit unit 230. As shown in FIG. 2, only the reference signal may be input to a first driving circuit 230-1, and the N control signals $S_1$ to $S_N$ may be input, together with the reference signal, to second to N+1-th driving circuits 230-2 to 230-(N+1). Hereinafter, configurations and operations of the respective driving circuits 230-1 to 230-(N+1) will be described with reference to FIGS. 5 and 6.

Figure 5:
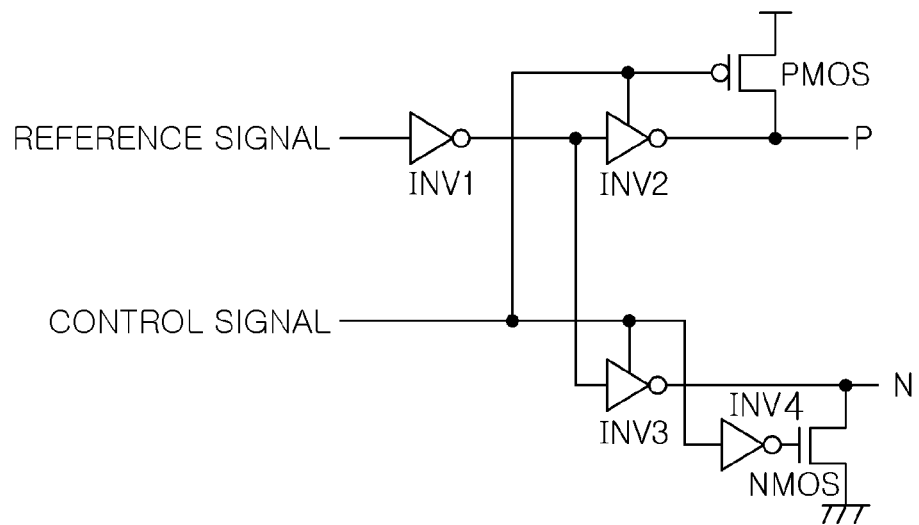
FIGS. 5 and 6 are circuit diagrams showing an example of a configuration of a driving circuit unit included in the gate driver circuit according to the embodiment of the present invention.
Figure 6:
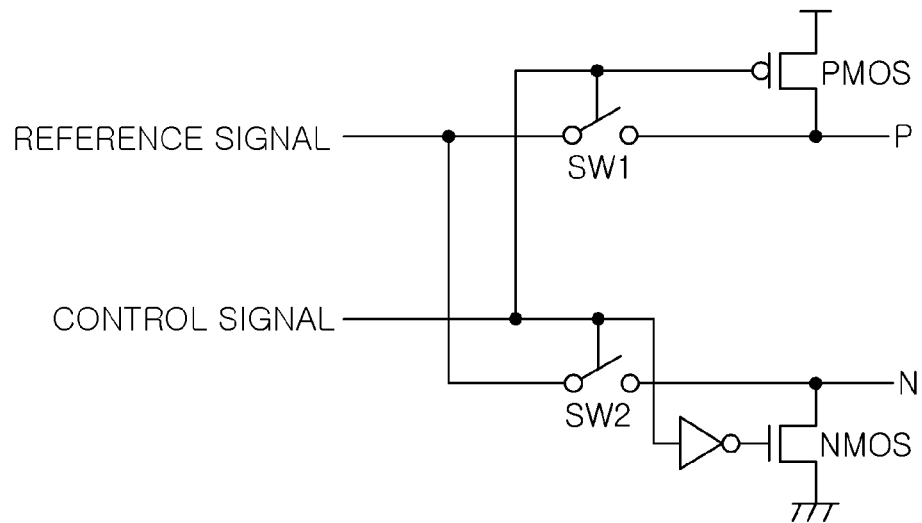

FIGS. 5 and 6 are circuit diagrams showing an example of a configuration of a driving circuit unit included in the gate driver circuit according to the embodiment of the present invention.

First referring to FIG. 5, the driving circuit according to the present embodiment may have a structure of a three-phase inverter circuit including three inverters INV1 to INV3 and two switch devices PMOS and NMOS. A reference signal may be a signal having a high or low level, and a control signal may have a level determined according to a connection state of a bonding pad corresponding to the control signal. Since the selecting circuit unit 220 shown in FIG. 3 is illustrated, the control signal may have a high level when the bonding pad is floated and have a low level when the bonding pad is connected to the reference voltage Vss.

First, in the case that the bonding pad is floated, such that the control signal has the high level, the three-phase inverter circuit is operated normally, such that both of the signals P and N output from the PMOS and the NMOS may have the same value as that of the reference signal. On the other hand, when the bonding pad is connected to the reference voltage Vss, such that the control signal has the low level, the three-phase inverter circuit is not operated, such that the signal P may be pulled up by the PMOS and the signal N may be pulled down by the NMOS.

FIG. 6 shows an example of a driving circuit configured using analog switches SW1 and SW2. In the case that the control signal has the high level, that is, the bonding pad is floated as illustrated in FIG. 6, both of the analog switches SW1 and SW2 are turned on and closed, such that both of the signals P and N may have the same value as that of the reference signal. On the other hand, when the bonding pad is connected to the reference voltage Vss, such that the control signal has the low level, the analog switches SW1 and SW2 are turned off and opened, such that the signal P may be pulled up and the signal N may be pulled down.

Figure 7:
FIGS. 7 and 8 are graphs for describing an operation of the gate driver circuit according to the embodiment of the present invention.
Figure 7:
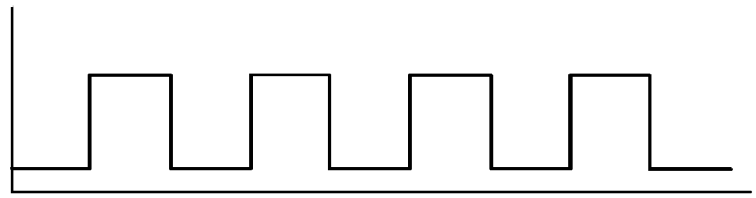
Figure 7:
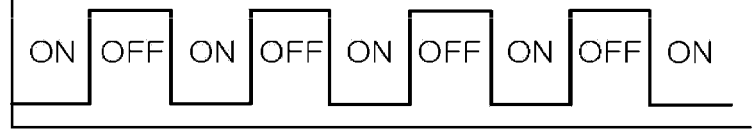
Figure 7:
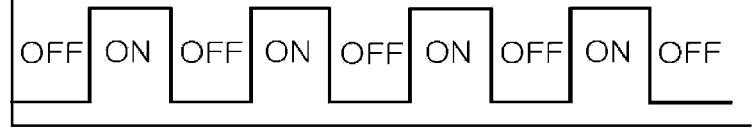
Figure 8:
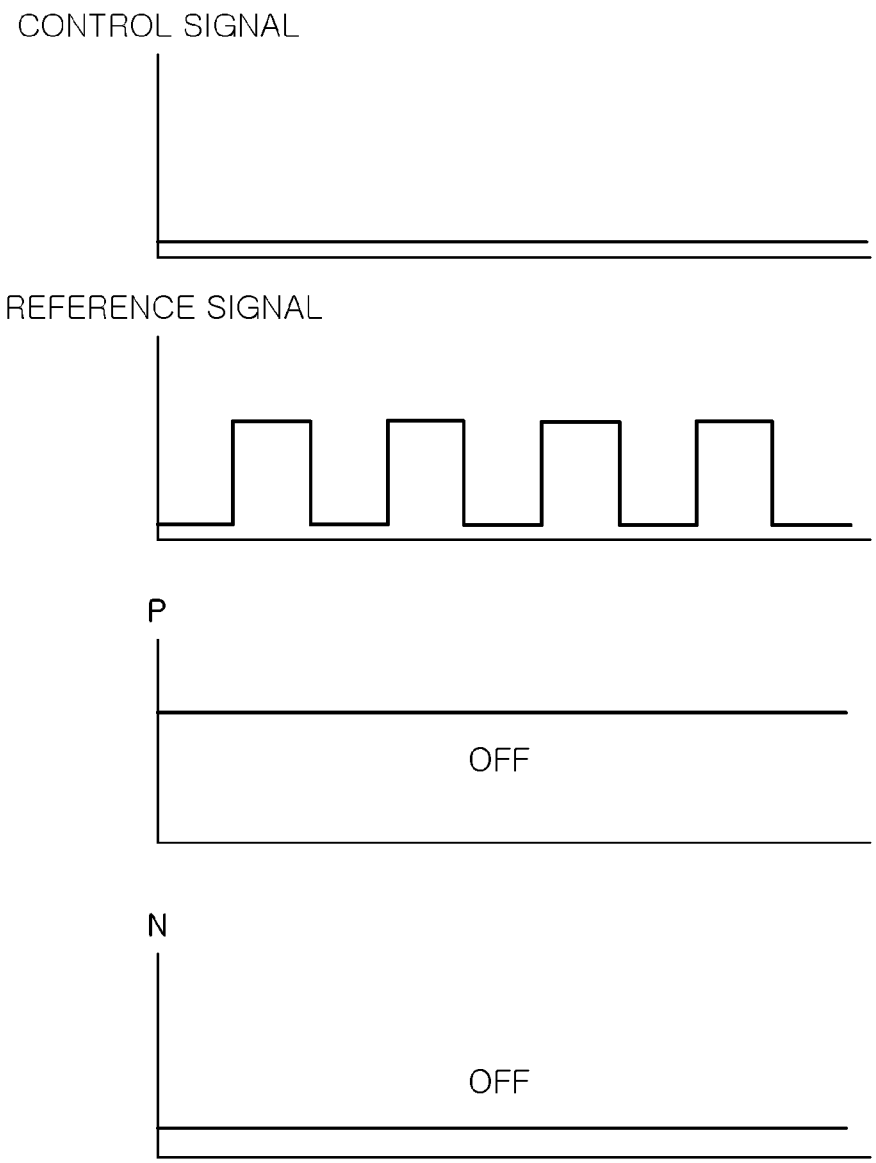

FIGS. 7 and 8 are graphs for describing an operation of the gate driver circuit according to the embodiment of the present invention.

FIG. 7 is a graph corresponding to the case in which a control signal has a high level. As described above with reference to FIGS. 5 and 6, when the control signal has the high level, the signals P and N output by the driving circuit may have a form in which they follow the reference signal as it is. On the other hand, when the control signal has the low level as shown in FIG. 8, the PMOS outputting the signal P is pulled up and the NMOS outputting the signal N is pulled down, such that the signal P may have the high level and the signal N may have the low level.

Through a process as described with reference to FIGS. 5 through 8, the driving circuits 230-1 to 230-(N+1) shown in FIG. 2 may generate the signals $P_1$ to $P_{N+1}$ and $N_1$ to $N_{N+1}$, respectively. The signals $P_1$ to $P_{N+1}$ may be input to gate terminals of $PMOS_1$ to $PMOSN_{N+1}$ of the output signal generating unit 210, respectively, to determine turning-on and turning-off of $PMOS_1$ to $PMOS_{N+1}$. Likewise, the signals $N_1$ to $N_{N+1}$ may be input to gate terminals of $NMOS_1$ to $NMOS_{N+1}$ of the output signal generating unit 210, respectively, to determine turning-on and turning-off of $NMOS_1$ to $NMOS_{N+1}$.

When all of the bonding pads PAD 1, PAD 2, ..., PAD N are connected to the reference voltage Vss, all of the control signals $S_1$ to $S_N$ may have the low level, all of the signals $P_1$ to $P_{N+1}$ output by the driving circuits 230-1 to 230-(N+1) may have the high level, and all of the signals $N_1$ to $N_{N+1}$ output by the driving circuits 230-1 to 230-(N+1) may have the low level (See the graph of FIG. 8). Therefore, only $PMOS_1$ and $NMOS_1$ of the output signal generating unit 210 may generate the output signal OUT, which has a small current value.

On the other hand, when all of the bonding pads PAD 1, PAD 2, ..., PAD N are not connected to the reference voltage Vss, but are floated, all of the control signals $S_1$ to $S_N$ may have the high level, and all of the signals $P_1$ to $P_{N+1}$ and $N_1$ to $N_{N+1}$ output by the driving circuits 230-1 to 230-(N+1) may have the same value as that of the reference signal. Since all switch devices included in the output signal generating unit 210 generate the output signal OUT, the output signal OUT may have a significantly high current value.

In summary, as the number of bonding pads that are not connected to the reference voltage Vss, but are floated increases, the output signal OUT having a higher current value may be obtained. On the other hand, as the number of bonding pads that are connected to the reference voltage Vss increases, the output signal OUT having a lower current value may be obtained. Therefore, portions of the N bonding pads PAD 1, PAD 2, . . . , PAD N are connected to the reference voltage Vss and the remaining bonding pads are floated according to a current magnitude of a required output signal OUT, whereby the current magnitude of the output signal OUT may be controlled.

Although a configuration capable of controlling the current magnitude of the output signal OUT according to the N bonding pads PAD 1, PAD 2, . . . , PAD N, has been described in the present embodiment, a circuit may also be configured in a form different from the above-mentioned form. For example, the number of bonding pads 2N may be prepared, and the N number of the 2N bonding pads may be used to generate control signals for turning the N number of PMOS transistors included in the output signal generating unit 210 on and off and the remaining bonding pads may be used to generate control signals for turning the N number of NMOS transistors included in the output signal generating unit 210 on and off. In the above-mentioned circuit configuration, since a sourcing output current and a sinking output current of the signals output by the gate driver circuit 200 may be separately controlled, a turning-on speed and a turning-off speed of IGBT devices connected to the gate driver circuit 200 may be differently implemented.

As set forth above, according to the embodiment of the present invention, the plurality of control signals are generated according to the connection state of the plurality of respective bonding pads, and turning-on and turning-off of each of the plurality of switch devices connected to the output terminal are controlled from the reference signal and the plurality of control signals. Through the above-mentioned configuration, the driving current for operating the IGBTs having different ratings may be generated in a single gate driver circuit.

While the present invention has been shown and described in connection with the embodiments, it will be apparent to those skilled in the art that modifications and variations can be made without departing from the spirit and scope of the invention as defined by the appended claims.

What is claimed is:

1. A gate driver circuit comprising:
   an output signal generating unit including a plurality of switch devices generating output signals;
   a selecting circuit unit generating a plurality of control signals according to a set selection state; and
   a plurality of driving circuit units receiving a reference signal and the plurality of control signals to control the plurality of switch devices,
   wherein the plurality of switch devices determine a level of the output signal by the plurality of control signals, and
   wherein each of the plurality of driving circuit units includes at least one of a three-phase inverter circuit and a plurality of analog switch circuits.

2. The gate driver circuit of claim 1, wherein the plurality of switch devices include a plurality of inverter circuits.

3. A gate driver circuit comprising:
   an output signal generating unit including a plurality of switch devices generating output signals;
   a selecting circuit unit generating a plurality of control signals according to a set selection state; and
   a plurality of driving circuit units receiving a reference signal and the plurality of control signals to control the plurality of switch devices, wherein
   the plurality of switch devices determine a level of the output signal by the plurality of control signals,
   the selecting circuit unit generates the plurality of control signals according to a connection state of each of a plurality of bonding pads, and
   the selecting circuit unit determines that values of control signals corresponding to bonding pads connected to a predetermined reference voltage among the plurality of bonding pads have a low level and determines that values of remaining control signals corresponding to remaining bonding pads that are floated among the plurality of bonding pads have a high level.

4. The gate driver circuit of claim 3, wherein a driving circuit unit receiving the control signal having the low level among the plurality of driving circuit units controls a switch device connected thereto to be turned off.

5. The gate driver circuit of claim 3, wherein a driving circuit unit receiving the control signal having the high level among the plurality of driving circuit units controls a switch device connected thereto to be turned on.

6. The gate driver circuit of claim 3, wherein each of the plurality of driving circuit units includes:
   a P-channel metal oxide semiconductor (PMOS) transistor pull-up connected when the value of the control signal has the low level; and
   an N-channel MOS (NMOS) transistor pull-down connected when the value of the control signal has the low level.

7. The gate driver circuit of claim 6, wherein the PMOS transistor and the NMOS transistor output the reference signal when the value of the control signal has the high level.

8. The gate driver circuit of claim 3, wherein the plurality of switch devices include a plurality of inverter circuits.

9. An operating method of a gate driver circuit, comprising:
   generating a plurality of control signals according to a set selection state;
   controlling turning-on and turning-off of each of a plurality of switch devices using a reference signal and the plurality of control signals; and
   determining a level of an output signal by turning-on and turning-off operations of each of the plurality of switch devices, wherein
   in the generating of the plurality of control signals, the plurality of control signals are generated according to a connection state of each of a plurality of bonding pads, and
   in the generating of the plurality of control signals, values of control signals corresponding to bonding pads that are connected to a predetermined reference voltage among the plurality of bonding pads are determined to have a low level, and values of remaining control signals corresponding to remaining bonding pads that are floated among the plurality of bonding pads are determined to have a high level.

10. The operating method of claim 9, wherein in the controlling, a switch device to which a control signal having the low level value is input is turned on.

11. The operating method of claim 9, wherein in the controlling, a switch device to which a control signal having the high level value is input is turned off.

\* \* \* \* \*